(12) United States Patent
Stotz

(10) Patent No.: US 6,340,791 B1
(45) Date of Patent: Jan. 22, 2002

(54) MEANS AND PROCESS FOR ENCAPSULATING ELECTRIC CIRCUITS BY MEANS OF INJECTION MOLDING

(75) Inventor: Oliver Stotz, Rohnstäter (DE)

(73) Assignee: Mannesmann VDO AG (DE)

( * ) Notice: Subject to any disclaimer, the term of this patent is extended or adjusted under 35 U.S.C. 154(b) by 0 days.

(21) Appl. No.: 09/379,473

(22) Filed: Aug. 23, 1999

(30) Foreign Application Priority Data

Aug. 22, 1998 (DE) .......................................... 198 38 266

(51) Int. Cl.[7] .................................................. H02G 3/08
(52) U.S. Cl. ..................................................... 174/52.1
(58) Field of Search ........................ 174/52.1, 50, 52.2, 174/52.3, 52.4, 52.5

(56) References Cited

U.S. PATENT DOCUMENTS

| | | |
|---|---|---|
| 4,668,448 A | 5/1987 | Weber et al. |
| 4,975,312 A | 12/1990 | Lusignea et al. |
| 5,165,985 A * | 11/1992 | Wiste et al. ................ 428/209 |
| 5,260,380 A | 11/1993 | Isayev |
| 5,761,048 A * | 6/1998 | Trabucco .................... 361/760 |

FOREIGN PATENT DOCUMENTS

| | | | |
|---|---|---|---|
| DE | 35 22 091 A1 | 1/1987 | |
| DE | 43 25 712 A1 | 2/1995 | |
| DE | 44 26 350 A1 | 2/1996 | |
| DE | 44 36 523 A | 4/1996 | ......... H05K/13/00 |
| EP | 0 453 990 A2 | 4/1991 | ............ B29D/7/00 |
| WO | WO 91/06410 | 5/1991 | ............. B29B/9/12 |

* cited by examiner

*Primary Examiner*—Adolf Deneke Berhans
(74) *Attorney, Agent, or Firm*—Robert J. Depke; Mayer, Brown & Platt

(57) ABSTRACT

A means and a process for protecting an electric circuit from ambient influences, the circuit being surrounded with a thermoplastic polymer which is applied by injection molding, the thermoplastic polymer comprising oriented macromolecules. The components of the circuit are aligned with their axis most sensitive to alternating tensile loading on average parallel to the respective direction of flow of the injected polymer in the vicinity of the components.

18 Claims, 3 Drawing Sheets

MEANS AND PROCESS FOR ENCAPSULATING ELECTRIC CIRCUITS BY MEANS OF INJECTION MOLDING

BACKGROUND OF THE INVENTION

1. Field of the Invention

The present invention relates to a means and a process for protecting an electric circuit from ambient influences. Specifically, in accordance with the present invention, an electric circuit is surrounded with a thermoplastic polymer which is applied by injection molding.

2. Description of the Related Art

Polymers are frequently used in the automotive industry, where electric circuits are exposed to high levels of dirt and moisture. The circuits are surrounded with the polymer, which tightly seals them and consequently makes them insensitive to moisture and dirt. In DE 44 36 523 A1, a circuit is surrounded with a polymer by the injection molding technique. However, this gives rise to the problem that the thermal stresses which act on the components when the circuit heats up may become inadmissibly high on account of the high thermal expansion of the polymer and damage the components of the circuit.

In particular, the connection contacts of the components may tear off, since their connection locations on the components are sensitive to alternating tensile loading.

An object of the invention is to provide a means and a process with which electric circuits can be permanently protected against dirt and moisture without the components being subjected to great loading due to thermal expansion.

SUMMARY OF THE INVENTION

The above object is achieved according to the invention by the thermoplastic polymer containing oriented macromolecules and by the components of the circuit being aligned with their axis most sensitive to alternating tensile loading on average parallel to the respective direction of the macromolecules present in the vicinity of the components. Particularly well suited for this purpose is a thermotropic, liquid-crystalline thermoplastic, such as can be obtained for example from the Hoechst company under the trade name Vectra.

In the molten state, the macromolecules of such a polymer form liquid-crystalline structures, so that they are aligned parallel to one another. Moreover, during injection the macromolecules align themselves parallel to the principal shearing planes of the polymer stream, so that they thus lie parallel to the walls of the flow channel when there is laminar flow. The coefficient of thermal expansion of such an encapsulating polymer body is higher perpendicular to the average direction of orientation of the macromolecules than parallel thereto. The rod-shaped macromolecules prevent the material surrounding them from expanding and consequently effectively influence the specific thermal expansion of the overall material. On account of their position along the sensitive axis of the components, this has the result that the thermal stresses of the material in the axial direction are not transferred to the encapsulated components and the latter are protected against ruptures from sustained load.

The coefficient of thermal expansion of the overall material can be adjusted in a large range by the flow parameters during the encapsulation with the liquid polymer. During encapsulation, it must be ensured that no flow lines occur, that the flow remains predominantly laminar and that the polymer stream flows in the direction of the longitudinal axes of the components to be encapsulated. For reasons of strength, the polymer may, furthermore, also be mixed with fibrous substances, such as glass fibers, as often already carried out in practice.

A first development of the invention provides that the circuit is held in a solid support housing, which forms at least part of the injection mold for the thermoplastic polymer. The support housing may remain on the circuit after encapsulation and acts as a stabilizing enclosure. During encapsulation, a suitable second half-mold is pressed against the open side of the support housing and is removed after cooling down.

In an alternate embodiment of the invention, a formation of intrinsically stable conductor tracks (lead frame) is embedded in a first layer of the polymer, the components of the circuit are connected to locations of the conductor tracks not covered by the first polymer layer and the circuit is surrounded by a second layer of the polymer. In this case it is provided in an advantageous way that the first polymer layer has molded parts to which the components of the circuit are fastened. After enclosing the lead frame, which takes place by the injection-molding technique, the components of the circuit are fitted into or onto the mold parts provided for this purpose and the contact pins are soldered or welded to the exposed parts of the conductor tracks. Subsequently, the entire arrangement is encapsulated with the polymer and is thus sealed. This procedure can also be used to produce many small circuits at one time, by dividing up the lead frame correspondingly and separating it at connecting cross-pieces after enclosure.

In another embodiment of the invention, the circuit is applied to a solid support, produced by injection molding, which likewise consists of the polymer, and the circuit together with the support is surrounded by the polymer. In this case, it is advantageous if the conductor tracks of the circuit are applied to the support by hot embossing or if they are electroplated onto the support. In this way, the circuit can be built up on the stable support, as on a conventional circuit board, and subsequently be enclosed with the polymer.

Even during the production of the support it must be ensured that the directed specific thermal expansion is at the least in the direction of the components to be applied and that, before encapsulation, the components of the circuit are aligned along the direction of flow and consequently the principal direction of orientation of the macromolecules of the polymer. The direction of flow of the polymer can be controlled into the desired direction by correspondingly distributed gates. An elongate form of support is advantageously chosen for production reasons, because then only few gating locations are required—possibly only one.

In a first embodiment of the process according to the invention, the circuit is introduced into a solid housing and is fastened therein and the housing is closed with a suitable cover and is subsequently filled with the polymer by injection. In this way, even polymers of inadequate mechanical strength can be used to ensure a durable encapsulation of the circuit. If the polymer forms a chemically stable surface, the cover is removed again after encapsulation.

For producing the configuration with the support, the conductor tracks of the circuit are applied to a solid support, the components of the circuit are fastened onto the conductor tracks and the arrangement is subsequently surrounded with the polymer.

For producing a configuration with intrinsically stable conductor tracks, a formation of intrinsically stable conductor tracks (lead frame) is partially surrounded with the polymer, the connection contacts for the components of the circuit being left free, that the components are applied to the lead frame reinforced in this way with the polymer and that the arrangement is subsequently surrounded with the polymer.

The invention provides numerous embodiments which will be understood by those skilled in the art based on the present disclosure. One of these is described below and is schematically represented in the drawing by means of several figures, in which:

BRIEF DESCRIPTION OF THE DRAWINGS

The same parts are provided in the figures with the same designations.

DETAILED DESCRIPTION OF THE PREFERRED EMBODIMENTS

Figure 1:
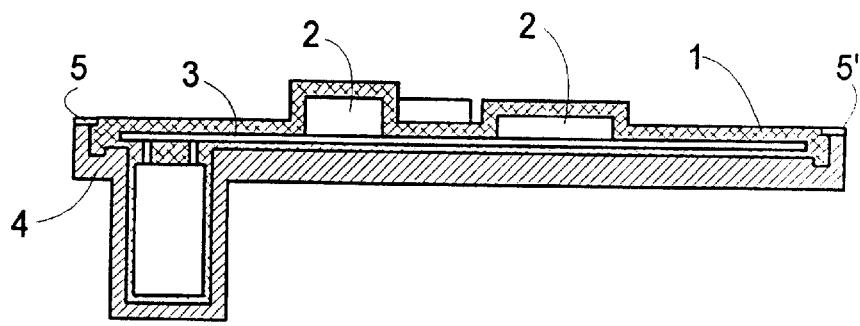
FIG. 1 is a sectional view of an electric circuit encapsulated according to an embodiment of the invention.

FIG. 1 shows an electric circuit which is encapsulated with a material 1 according to an embodiment of the present invention, in a sectional representation. The circuit components 2 are firmly welded to a circuit plate (lead frame) 3. During encapsulation, the electric circuit is held in a rigid housing 4, which at the same time serves as a lower encapsulating mold half. The housing 4 remains on the encapsulated circuit after the encapsulating operation. The gating location 5, at which the polymer is injected during encapsulation, can be seen on the encapsulated circuit. Opposite the gating location 5 there is a venting opening 5'.

Figure 2:
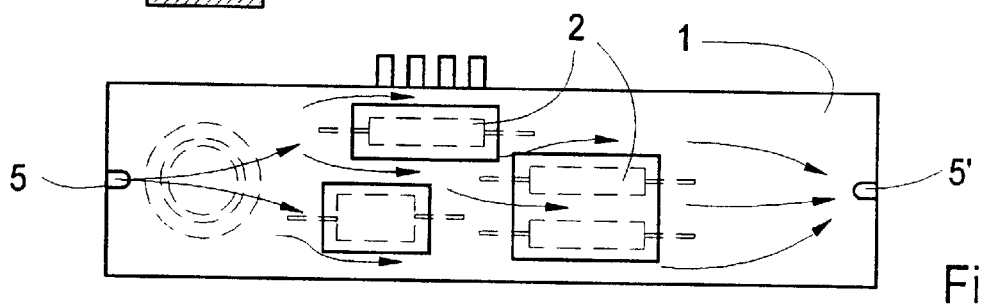
FIG. 2 shows the circuit of FIG. 1 in plan view.

In the plan view of the encapsulated circuit (FIG. 2), the directions of flow of the polymer 1, which it takes during encapsulation, are marked. The components 2 of the circuit are arranged with their axes parallel to the direction of flow. During encapsulation, the macromolecules order themselves along the principal shearing planes in the liquid polymer 1. That is to say, when there is laminar flow, the molecules align themselves parallel to the direction of flow and remain in this alignment in the solidified polymer 1. This produces a fibrous structure in the polymer 1, the structure elements of which have molecular dimensions however. By contrast with fiber-reinforced plastics, consequently not only can the strength of the material be positively influenced, but the specific thermal expansion can also be reduced virtually at will in the longitudinal direction. In addition, fibrous substances can also be introduced into the polymer, in order to increase the mechanical strength of the material.

Figure 3:
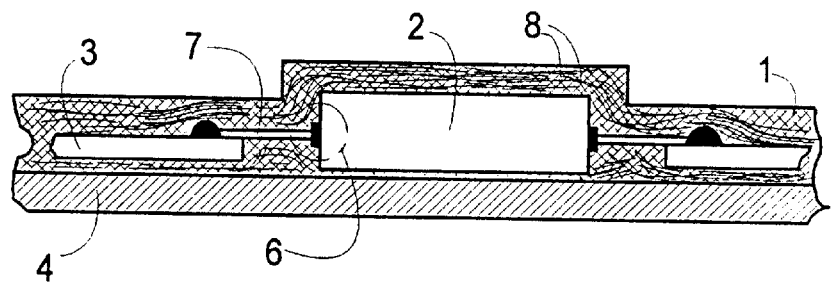
FIG. 3 shows an enlarged detail of the encapsulated circuit.

FIG. 3 shows a single component 2 in an enlarged representation. The soldering locations 6, by which the contacting pins 7 of the component 2 are fastened to the component 2 itself, cannot withstand high tensile loads. They too are sensitive to alternating tensile loads, such as are produced by thermal stresses. In the case of conventionally encapsulated components, the contacting pins 7 frequently break off at these soldering locations 6 and the circuit becomes unusable. If the component 2, as represented, is aligned along the direction of flow of the polymer 1 before encapsulation, the macromolecules 8 arrange themselves parallel to the axis of the component 2. In this position, they relieve the sensitive soldering locations 6 of the component 2 when thermal stresses occur. The specific thermal expansion of the encapsulating composition 1 corresponds in the longitudinal direction to that of the circuit components 2.

Figure 4:
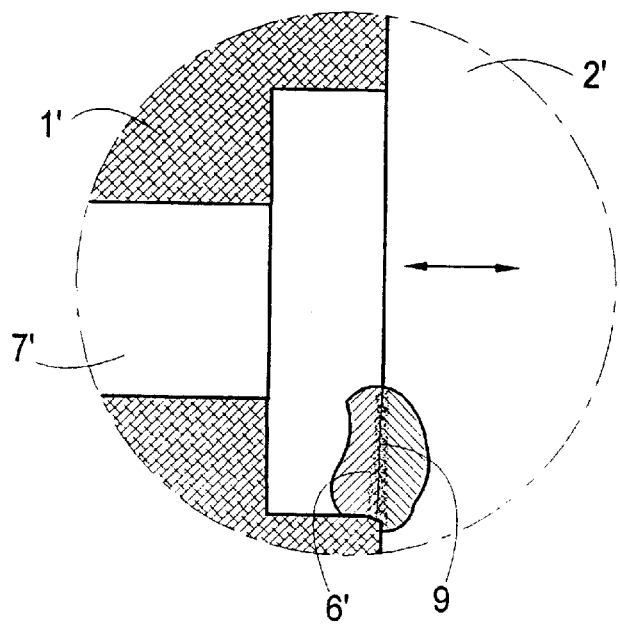
FIG. 4 shows a damaged soldered connection in the case of a circuit component on an electric circuit encapsulated by a conventional method.

In FIG. 4, a damaged soldering location 6' on a component 2' encapsulated with conventional encapsulating composition 1' is represented in an enlarged form. The alternating tensile loading on account of thermal stresses has caused a crack 9, which after some time may lead to the failure of the component 2'.

Figure 5:
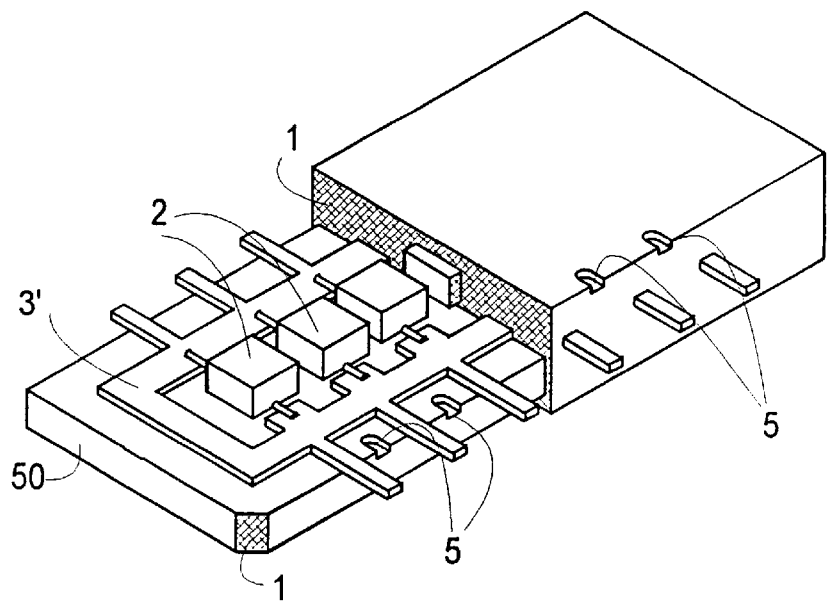
FIG. 5 shows a circuit mounted on a support in a perspective view, the outer polymer enclosure having been partly removed.
Figure 6:
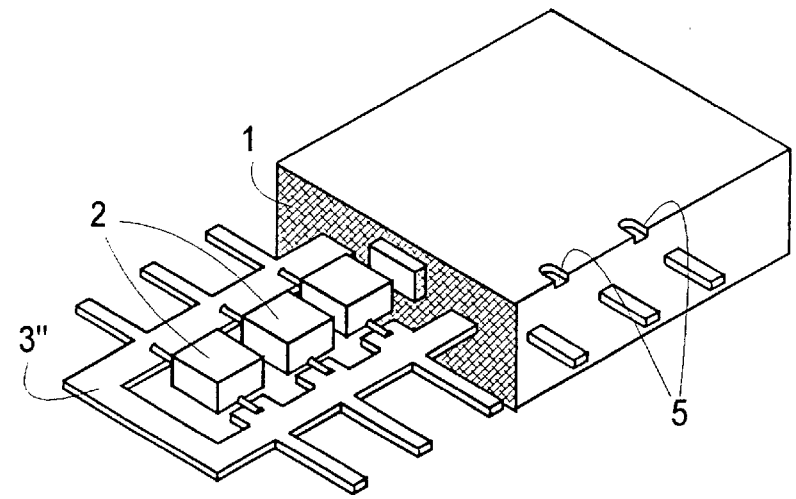
FIG. 6 shows a circuit mounted on a lead frame in a perspective view, the outer polymer enclosure having been partly removed.

A circuit built up on a support 50 is represented in FIG. 5. The conductor tracks 31 may be applied by hot embossing or by electroplating. In the case of the use of intrinsically stable conductor plates 3", so-called lead frames, it is possible to dispense entirely with a support, as represented in FIG. 6. The circuit is in this case built up on the conductor plate 3" and then encapsulated.

Figure 7:
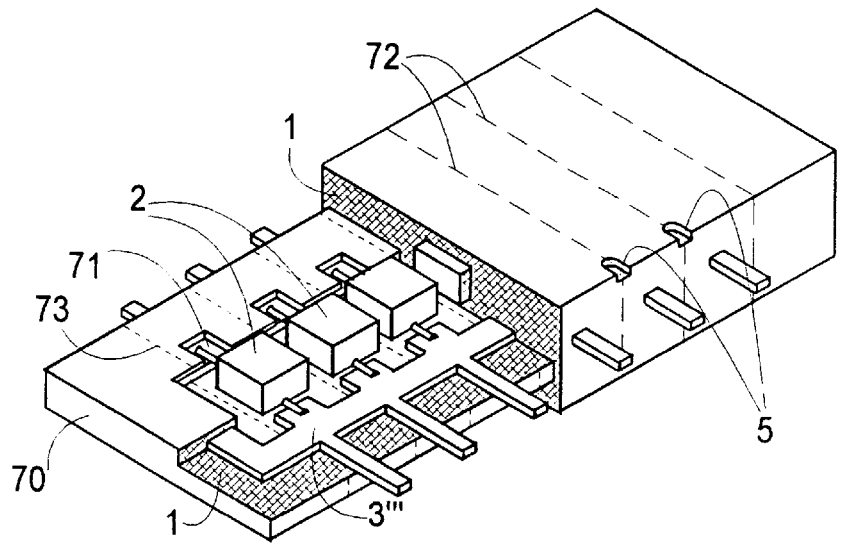
FIG. 7 shows a circuit mounted on an enclosed lead frame in a perspective view, the encapsulation and the outer polymer enclosure having been partly removed.

If a very thin lead frame 3''' is to be used or if a plurality of small circuits are produced at one time, the lead frame must first of all be surrounded with a stabilizing enclosure 70, as FIG. 7 shows, of the polymer. In this case, the connection locations 71 for the components 2 of the circuit initially remain free. The finished circuit may, if appropriate, be divided up along the dashed lines 72, in order to obtain the individual circuits. In the case of another procedure, the enclosed lead frame is divided up at the dashed lines 73 before final encapsulation. The individual parts consequently produced are subsequently encapsulated individually.

Figure 8:
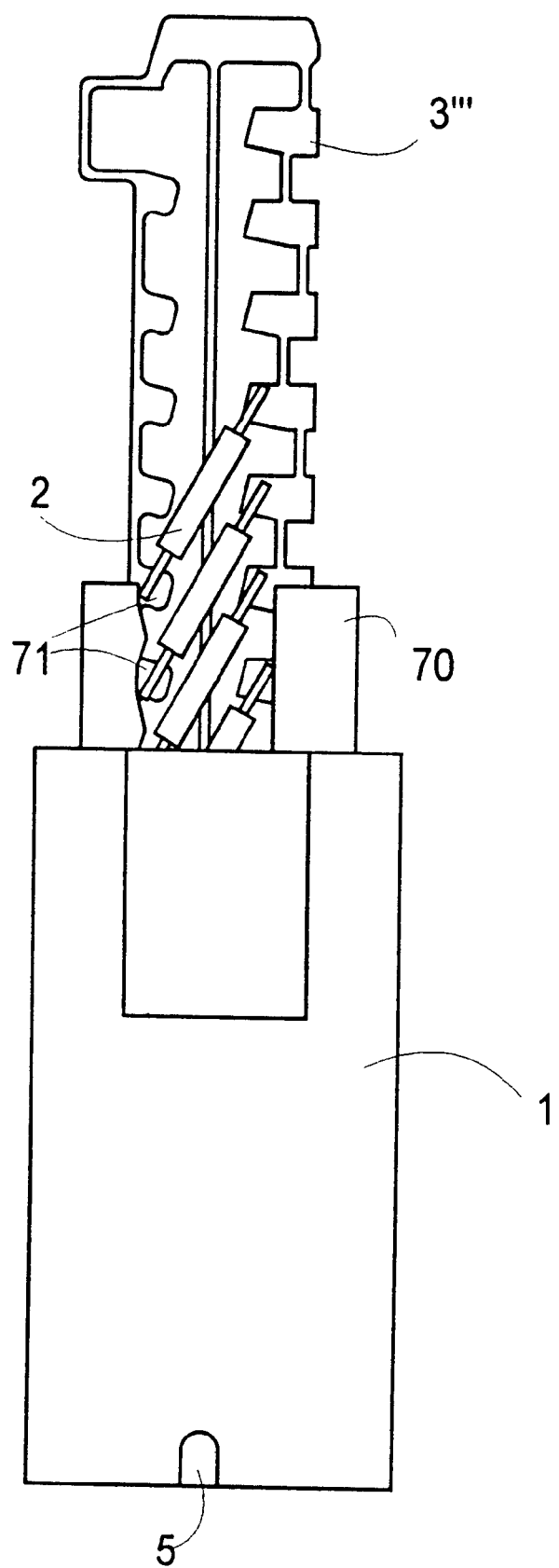
FIG. 8 shows a circuit mounted on an encapsulated lead frame in plan view, the encapsulation and the outer polymer enclosure having been partly removed.

FIG. 8 shows a further example of the use of an enclosed lead frame, an elongate form of the circuit having been chosen for production reasons. The components of the circuit in this case lie obliquely, so that a space saving is obtained. The lead frame 3''' is surrounded with an enclosure 70. The components 2 are subsequently fastened on the contact plates 71 provided for this purpose and the entire arrangement is encapsulated.

What is claimed is:

1. A structure for protecting an electric circuit comprising:
a circuit surrounded with a thermoplastic polymer which is applied by injection molding, wherein the thermoplastic polymer is comprised of oriented macromolecules and wherein a majority of the components of the circuit are aligned with their axis most sensitive to alternating tensile loading being parallel to the respective direction of the macromolecules present in the vicinity of the components.

2. The structure of claim 1, wherein the polymer is a thermotropic liquid-crystalline polymer.

3. The structure of claim 1, wherein the circuit is secured within a solid support housing, said housing forming at least part of the injection mold for the thermoplastic polymer.

4. The structure of claim 1, wherein a formation of conductor tracks is at least partially embedded in a first layer of the polymer, wherein the components of the circuit are connected to the conductor tracks that are not covered by the first polymer layer and wherein the circuit is surrounded by a second layer of the polymer.

5. The structure as claimed in claim 4, wherein the first polymer layer has molded parts to which the components of the circuit are fastened.

6. The structure as claimed in claim 1, wherein the circuit is applied to a solid support, produced by injection molding, which is comprised of the polymer, and wherein the circuit together with the support is surrounded by the polymer.

7. The structure as claimed in claim 6, wherein the conductor tracks of the circuit are applied to the support by hot embossing.

8. The structure as claimed in claim 6, wherein the conductor tracks of the circuit are electroplated onto the support.

9. A process for protecting an electric circuit comprising the steps of:
   prior to encapsulation, arranging a majority of the components of a circuit such that their axis which is most sensitive to alternating tensile loading is at least substantially parallel to a principal direction of orientation; and
   thereafter surrounding the circuit with a thermoplastic polymer via injection molding such that the orientation of the macromolecules of the polymer is at least substantially parallel to the principal direction of the orientation.

10. The process as claimed in claim 9, further comprising a step of inserting the circuit into a housing; closing the housing with a cover and subsequently filling the housing with the polymer.

11. The process as claimed in claim 10, further comprising a step of removing the cover after encapsulation.

12. The process as claimed in claim 9, further comprising a step of attaching conductor tracks of the circuit to a solid support; connecting components of the circuit to the conductor tracks; and surrounding the components with the polymer.

13. The process as claimed in claim 9, further comprising a step of partially surrounding the conductor tracks with the polymer, wherein connection contacts for the components of the circuit are free of polymer; and connecting the components to the connection contacts and thereafter surrounding the components with the polymer.

14. The method of claim 9, wherein a substantial a majority of the components of the circuit are arranged such that their axis which is most sensitive to alternating tensile loading is at least substantially parallel to a principal direction of orientation.

15. the method of claim 9, wherein all of the components of the circuit are arranged such that their axis which is most sensitive to alternating tensile loading is at least substantially parallel to a principal direction of orientation.

16. A structure for protecting an electric circuit comprising:
   a circuit surrounded with a thermoplastic polymer which is applied by injection molding, wherein the thermoplastic polymer is comprised of oriented macromolecules and wherein a majority of the components of the circuit are aligned with their axis most sensitive to alternating tensile loading being parallel to the respective direction of the macromolecules present in the vicinity of the components.

17. A structure for protecting an electric circuit of claim 16, wherein a substantial majority of the components of the circuit are aligned with their axis most sensitive to alternating tensile loading being parallel to the respective direction of macromolecules.

18. A structure for protecting an electric circuit of claim 16, wherein all of the components of the circuit are aligned with their axis most sensitive to alternating tensile loading being parallel to the respective direction of macromolecules.

* * * * *